United States Patent
Kasahara et al.

(10) Patent No.: US 8,921,276 B2
(45) Date of Patent: Dec. 30, 2014

(54) SUBSTRATE FOR SUPERCONDUCTING WIRE ROD, SUPERCONDUCTING WIRE ROD, AND METHOD FOR PRODUCING SUPERCONDUCTING WIRE ROD

(75) Inventors: Masayasu Kasahara, Tokyo (JP); Hiroyuki Fukushima, Tokyo (JP); Yoshikazu Okuno, Tokyo (JP); Yuko Hayase, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 4 days.

(21) Appl. No.: 13/813,849

(22) PCT Filed: Nov. 2, 2011

(86) PCT No.: PCT/JP2011/075340
§ 371 (c)(1),
(2), (4) Date: Feb. 1, 2013

(87) PCT Pub. No.: WO2012/060425
PCT Pub. Date: May 10, 2012

(65) Prior Publication Data
US 2013/0130915 A1   May 23, 2013

(30) Foreign Application Priority Data

Nov. 2, 2010 (JP) ................. 2010-246056

(51) Int. Cl.
*H01B 12/06* (2006.01)
*H01B 12/02* (2006.01)
(Continued)

(52) U.S. Cl.
CPC ............ *H01B 13/00* (2013.01); *C01G 45/1264* (2013.01); *C01G 51/70* (2013.01);
(Continued)

(58) Field of Classification Search
CPC ... H01L 39/126; H01L 39/24; H01L 39/2461; H01B 12/06; C30B 29/22; C01G 45/1264; C01G 1/00
USPC ............... 505/230, 237, 238, 239, 434, 470; 428/472, 701, 702; 174/125.1; 427/62
See application file for complete search history.

(56) References Cited

U.S. PATENT DOCUMENTS 6,764,770 B2 * 7/2004 Paranthaman et al. ....... 428/469
2004/0197475 A1 * 10/2004 Stadel et al. ............. 427/255.31

FOREIGN PATENT DOCUMENTS

JP   2001 73151   3/2001
JP   2003 96563   4/2003
(Continued)

OTHER PUBLICATIONS

U.S. Appl. No. 13/813,748, filed Feb. 1, 2013, Okuno, et al.
(Continued)

*Primary Examiner* — Stanley Silverman
*Assistant Examiner* — Kallambella Vijayakumar
(74) *Attorney, Agent, or Firm* — Oblon, Spivak, McClelland, Maier & Neustadt, L.L.P.

(57) ABSTRACT

The phase transition temperature, at which the crystal lattice of LMO that constitutes an oxide layer as an intermediate layer or as a part of an intermediate layer becomes cubic, is lowered. A substrate for a superconducting wire rod includes an oxide layer (LMO layer (22)) which contains, as a principal material, a crystalline material represented by the compositional formula: $La_z(Mn_{1-x}M_x)_wO_{3+\delta}$ (wherein M represents at least one of Cr, Al, Co or Ti, $\delta$ represents an oxygen non-stoichiometric amount, $0<w/z<2$, and $0<x\leq1$).

20 Claims, 6 Drawing Sheets (51) Int. Cl.
*H01L 39/24* (2006.01)
*H01B 13/00* (2006.01)
*C01G 45/12* (2006.01)
*C01G 51/00* (2006.01)
*H01L 39/14* (2006.01)

(52) U.S. Cl.
CPC .............. *H01L 39/143* (2013.01); *H01B 12/02* (2013.01); *H01L 39/2454* (2013.01); *C01P 2002/54* (2013.01); *C01P 2002/77* (2013.01); *Y10S 505/704* (2013.01)
USPC ........... 505/239; 505/230; 505/237; 505/434; 505/470; 505/704; 428/472; 428/701; 428/702; 174/125.1; 427/62; 204/192.11

(56) References Cited

FOREIGN PATENT DOCUMENTS

| | | |
|---|---|---|
| JP | 2003 203531 | 7/2003 |
| JP | 2007 515053 | 6/2007 |
| JP | 2010 513180 | 4/2010 |
| JP | 2010 103021 | 5/2010 |

OTHER PUBLICATIONS

International Search Report Issued Dec. 6, 2011 in PCT/JP11/75340 Filed Nov. 2, 2011.

\* cited by examiner

SUBSTRATE FOR SUPERCONDUCTING WIRE ROD, SUPERCONDUCTING WIRE ROD, AND METHOD FOR PRODUCING SUPERCONDUCTING WIRE ROD

TECHNICAL FIELD

The invention relates to a substrate for a superconducting wire rod, a superconducting wire rod, and a method for producing a superconducting wire rod.

BACKGROUND ART

In a superconducting wire rod that is formed by growing a thin film of an oxide superconductor on a substrate such as a metal tape, the characteristics of the oxide superconductor as a conductor depend largely on the crystallographic orientation. Thus, in order to impart high critical current density (Jc) characteristics, it is necessary to orient the crystallographic orientation of the oxide superconductor at a high level.

Regarding the technology for orienting the crystallographic orientation of an oxide superconductor, there are available methods of growing a superconducting layer on a substrate having biaxial orientation or on a product obtained by forming a biaxially oriented thin film (intermediate layer) on a substrate. An example of the method of forming an intermediate layer that is biaxially oriented, on a substrate includes a method of forming a thin film by using an ion beam assist (for example, Patent Document 1: Japanese Patent Application Laid-Open (JP-A) No. 2003-96563).

In the case of producing a thin film laminate structure of a superconducting layer and an intermediate layer in such a manner, the thin film undergoes epitaxial growth in which the crystal orientation of the growing thin film inherits the crystal orientation of the substrate or an underlying thin film layer, which serves as a template. Therefore, in order to enhance the crystal orientation of the superconducting layer, it is necessary to enhance the crystal orientation of the intermediate layer that serves as a template for the superconducting layer.

Patent Document 2 (Japanese Patent Application National Publication (Laid-Open) No. 2007-515053) discloses a technology of forming an intermediate layer that underlies a superconducting layer in a superconducting wire rod, from $(La_{1-x}Sr_x)MnO_3$, which is obtained by doping the A sites (La sites) of LMO with Sr.

Similarly, Patent Document 3 (Japanese Patent Application National Publication (Laid-Open) No. 2010-513180) discloses a technology of forming an intermediate layer that underlies a superconducting layer in a superconducting wire rod, from $(La_{1-x}M_x)MnO_3$, which is obtained by doping the La sites of LMO with an M element (M represents any one of Ca, Sr or Ba).

DISCLOSURE OF INVENTION

Technical Problem

Here, in connection with the formation of a laminate structure of a superconducting layer and an intermediate layer, when a crystalline material represented by the compositional formula $LaMnO_{3+\delta}$ (hereinafter, referred to as LMO), which has a phase transition point that is accompanied by a change in the crystal structure (crystal lattice), is grown as an oxide layer (thin film) of an intermediate layer or a part of an intermediate layer, in order for another oxide layer or another oxide superconducting layer (hereinafter, also referred to as other oxide thin film) that is formed on the oxide layer including LMO, to inherit the crystal orientation of the oxide layer including LMO, it is necessary to set the growth temperature of the oxide layer including LMO to be higher than the phase transition temperature.

Figure 4:
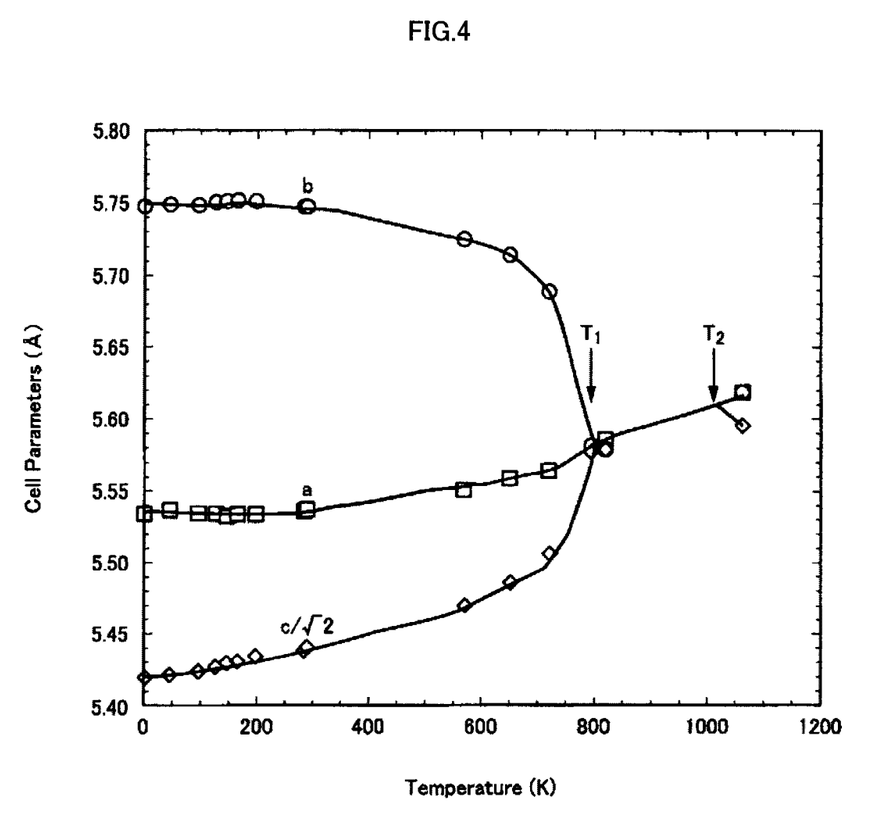
FIG. 4 is a diagram illustrating the state of change of the crystal lattice of LMO.

Hereinafter, the relation between the growth temperature and the phase transition temperature of LMO will be described by using FIGS. 4 and 5. FIG. 4 is a diagram illustrating the state of change of the crystal lattice of LMO. The vertical axis in FIG. 4 represents the axial length of LMO, while the horizontal axis in FIG. 4 represents the heating temperature of LMO. Furthermore, FIG. 5 is a diagram illustrating the X-ray diffraction intensity of $CeO_2$ (FIG. 5A) and the orientation rate of $CeO_2$ (FIG. 5B) when the film forming temperature employed at the time of forming a film of $CeO_2$ on an oxide layer including LMO is changed.

Specifically, as shown in FIG. 4, the crystal lattice of LMO changes from orthorhombic to cubic when the temperature of LMO is about 800 K (phase transition temperature T1) or higher, and further changes from cubic to rhombohedral when the temperature of LMO is about 1000 K (phase transition temperature T2) or higher. Since cubic LMO having less crystal strain as compared with other crystal lattices can inherit the crystal orientation of the underlying layer, it is necessary to set the growth temperature of the oxide layer including LMO at a high temperature ranging from T1 to T2, and to make the crystal lattice of LMO in the oxide layer including LMO into a cubic structure.

Furthermore, the phase transition of LMO exerts significant influence in the case of epitaxially growing of another thin film on the oxide layer including LMO.

Figure 5A:
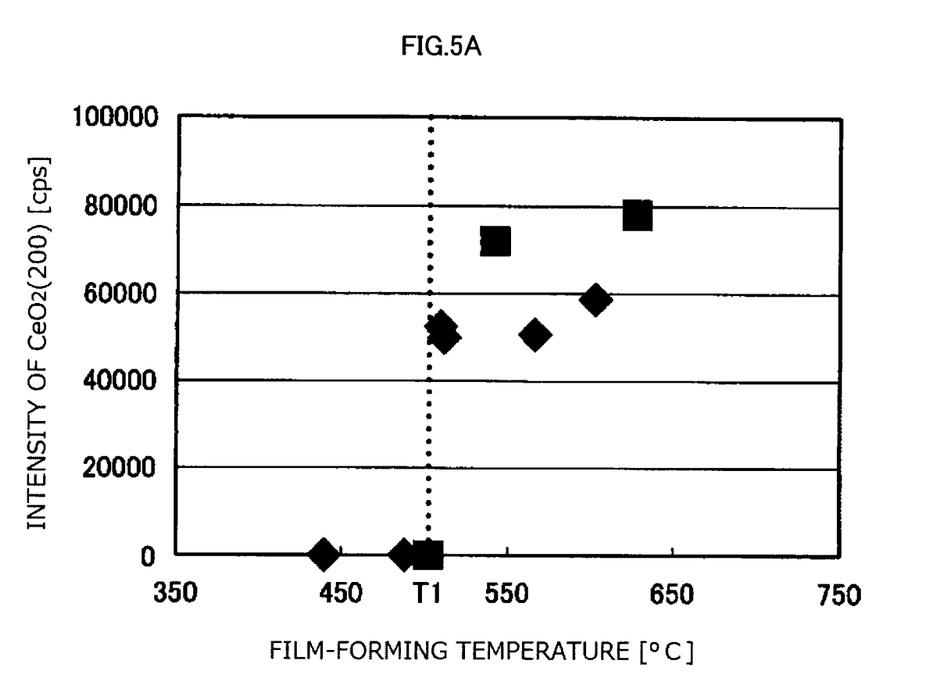
FIG. 5A is a diagram plotting the X-ray diffraction intensity (cps) of the $CeO_2$ (200) plane obtained when a $CeO_2$ film as another thin film that constitutes a part of an intermediate layer is formed on an oxide layer formed of LMO and the film forming temperature at the time of film forming is changed.
Figure 5B:
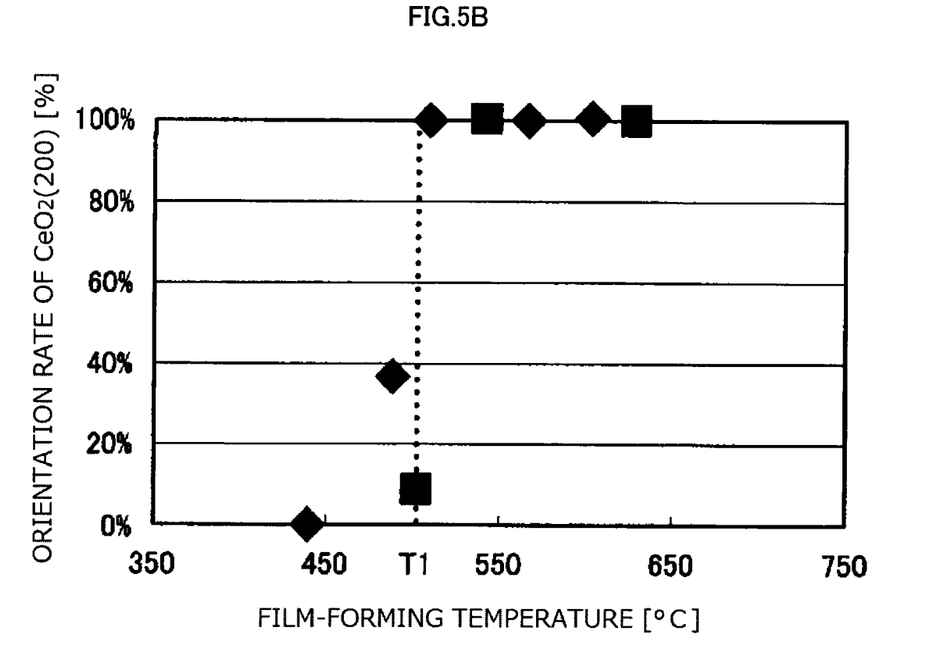
FIG. 5B is a diagram plotting the orientation rate (%) of the $CeO_2$ (200) plane obtained when the $CeO_2$ film as another oxide layer that constitutes a part of the intermediate layer is formed on the oxide layer formed of LMO and the film forming temperature at the time of film forming is changed.

Specifically, when another oxide thin film is epitaxially grown on an oxide layer including cubic LMO as described above while the substrate (also including the oxide layer including LMO) is heated, as shown in FIGS. 5A and 5B, if the film forming temperature is lower than the phase transition temperature T1 of LMO, the crystal lattice of LMO that forms the underlying oxide layer changes from cubic to orthorhombic, and it becomes difficult to achieve epitaxial growth of another oxide thin film on the oxide layer. Therefore, not only when an oxide layer including LMO is formed, but also when another oxide thin film is formed on the oxide layer including LMO, it is necessary to set the film forming temperature to be higher than or equal to the phase transition temperature T1 (lower than or equal to T2) of LMO.

Meanwhile, FIG. 5A is a diagram plotting the X-ray diffraction intensity (cps) of $CeO_2$ (200) obtained when a $CeO_2$ film as another thin film that constitutes a part of the intermediate layer is formed on the oxide layer formed of LMO and the film forming temperature at the time of film forming is changed. FIG. 5B is a diagram plotting the orientation rate (%) of $CeO_2$ (200) obtained when a $CeO_2$ film as another oxide layer that constitutes a part of the intermediate layer is formed on the oxide layer formed of LMO, and the film forming temperature at the time of film forming is changed.

However, when the film forming temperature of the oxide layer including LMO or the film forming temperature of the other oxide layer formed thereon is set to be higher than or equal to T1, the substrate of the superconducting wire rod is subjected to a thermal history at a higher temperature for a longer time, and the mechanical strength of the superconducting wire rod is reduced.

From the above, it is understood that, when the oxide layer including LMO is used, in order to enable the epitaxial growth of another oxide thin film that is formed on the oxide layer is enabled while suppressing a decrease in the mechanical strength of the superconducting wire rod, it is desirable to lower the phase transition temperature T1 itself at which the crystal lattice of LMO becomes cubic.

Here, in order to lower the phase transition temperature T1, adjusting the composition of LMO as in the case of Patent Documents 2 and 3 may be considered. However, in Patent Documents 2 and 3, lowering of the phase transition temperature T1 is not regarded as the purpose of doping, and there is no description on the doping of the B sites (Mn sites).

The invention has been made in view of the facts described above, and it is an object of the invention to provide a substrate for a superconducting wire rod in which the phase transition temperature, at which the crystal lattice of LMO that constitutes an oxide layer as an intermediate layer or a part of an intermediate layer becomes cubic, is lowered, a superconducting wire rod, and a method for producing the superconducting wire rod.

Solution to Problem

The above-described object of the invention is solved by the means described below.

<1> A substrate for a superconducting wire rod, the substrate containing an oxide layer including, as a principal material, a crystalline material represented by the compositional formula $La_z(Mn_{1-x}M_x)_wO_{3+\delta}$, wherein M represents at least one of Cr, Al, Co or Ti, $\delta$ represents an oxygen non-stoichiometric amount, $0 < w/z < 2$, and $0 < x \leq 1$.

<2> The substrate for a superconducting wire rod as described in the item <1>, wherein an amount x of the substitution by M in the crystalline material is $0.1 \leq x \leq 1$.

<3> The substrate for a superconducting wire rod as described in the item <1> or <2>, in which w/z of the crystalline material is such that $0.8 \leq w/z \leq 1.1$.

<4> The substrate for a superconducting wire rod as described in any one of the items <1> to <3>, in which the substrate includes a substrate body including an orientation layer that is biaxially oriented, and the oxide layer is disposed on the orientation layer.

<5> The substrate for a superconducting wire rod as described in any one of the above items <1> to <4>, wherein a cap layer including a fluorite-type crystal structure composed of at least one of $CeO_2$ or $PrO_2$ is disposed on the oxide layer.

<6> A superconducting wire rod including the substrate for a superconducting wire rod described in any one of the items <1> to <5>, and a superconducting layer that is disposed on the substrate for a superconducting wire rod and includes an oxide superconductor.

<7> A method for producing a superconducting wire rod, the method including a step of forming an oxide layer containing, as a principal material, a crystalline material represented by the compositional formula $La_z(Mn_{1-x}M_x)_wO_{3+\delta}$ on a substrate while heating the substrate, wherein M represents at least one of Cr, Al, Co or Ti, $\delta$ represents an oxygen non-stoichiometric amount, $0 < w/z < 2$, and $0 < x \leq 1$; and a step of epitaxially growing a thin film on the oxide layer while heating the substrate on which the oxide layer is formed.

Advantageous Effects of Invention

According to the invention, a substrate for a superconducting wire rod in which the phase transition temperature at which the crystal lattice of LMO that constitutes an oxide layer as an intermediate layer or as a part of an intermediate layer becomes cubic, has been lowered, a superconducting wire rod, and a method for producing a superconducting wire rod could be provided.

BEST MODE FOR CARRYING OUT THE INVENTION

Hereinafter, a substrate for a superconducting wire rod, the superconducting rod, and a method for producing the superconducting wire rod according to an embodiment of the invention will be specifically described with reference to the attached drawings. Meanwhile, in the drawings, the same reference numerals will be assigned to members (constituent elements) having the same functions or equivalent functions, and further explanations thereof will not be repeated appropriately.

(Configuration of Superconducting Wire Rod and Method for Producing the Same)

Figure 1:
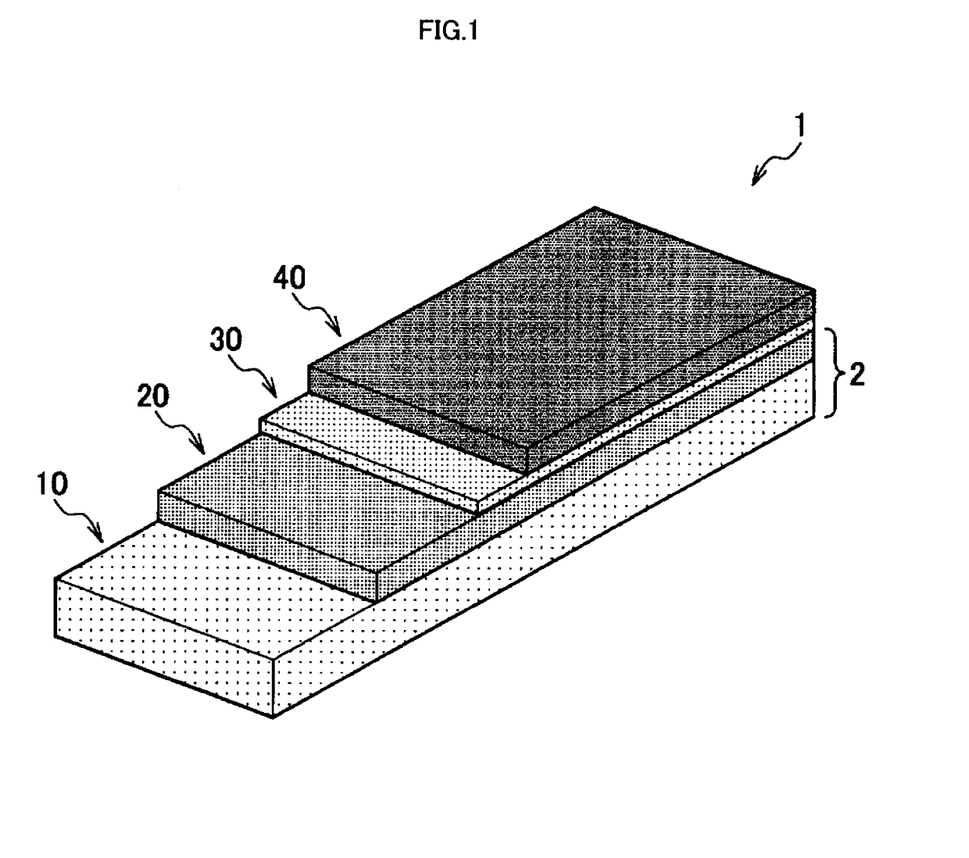
FIG. 1 is a diagram illustrating the laminate structure of a superconducting wire rod according to an embodiment of the invention.

FIG. 1 is a diagram illustrating the laminate structure of the superconducting wire rod according to the embodiment of the invention.

As shown in FIG. 1, a superconducting wire rod 1 has a laminate structure in which an intermediate layer 20, an oxide superconducting layer 30, and a protective layer 40 are formed in this order on a tape-shaped metal substrate 10. The tape-shaped metal substrate 10 and the intermediate layer 20 in FIG. 1 form the substrate 2 for a superconducting wire rod according to the embodiment of the invention.

The metal substrate 10 is a low-magnetic, non-oriented metal substrate. The metal substrate 10 is not limited to the tape-shaped material described above, but can be materials of various shapes such as a plate material, a wire rod and a strip. Regarding the material of the metal substrate 10, for example, a metal having excellent strength and heat resistance, such as Cu, Cr, Ni, Ti, Mo, Nb, Ta, W, Mn, Fe and Ag, or an alloy thereof can be used. Particularly preferred examples of the material include stainless steel, Hastelloy (registered trademark), and other nickel-based alloys, which are excellent in corrosion resistance and heat resistance. Furthermore, various ceramics may also be laid on these various metal materials.

The intermediate layer 20 is a layer formed on the metal substrate 10 in order to realize high in-plane orientation in the oxide superconducting layer 30, and the physical property values such as the thermal expansion ratio and the lattice constant indicate values that are intermediate between the metal substrate 10 and the oxide superconductor that forms the oxide superconducting layer 30. Meanwhile, the specific layer configuration will be described below.

The oxide superconducting layer 30 is formed on the intermediate layer 20 and is composed of an oxide superconductor, particularly a copper oxide superconductor. As this copper oxide superconductor, crystalline materials represented by the compositional formulas: $REBa_2Cu_3O_{7-\delta}$ (referred to as RE-123), $Bi_2Sr_2CaCu_2O_{8+\delta}$ (including a material doped with Pb at the Bi sites), $Bi_2Sr_2Ca_2Cu_3O_{10+\delta}$ (including a material doped with Pb at the Bi sites), and $Tl_2Ba_2Ca_{n-1}Cu_n$, $O_{2n+4}$ may be used. Furthermore, the copper oxide superconductor may also be composed of a combination of these crystalline materials.

Among the crystalline materials described above, $REBa_2Cu_3O_{7-\delta}$ is preferably used because the superconducting characteristics are satisfactory, and the crystal structure is simple. Furthermore, the crystalline material may be a polycrystalline material, or may be a single crystal material.

Meanwhile, RE in the formula: $REBa_2Cu_3O_{7-\delta}$ represents a single rare earth element such as Y, Nd, Sm, Eu, Gd, Dy, Ho, Er, Tm, Yb or Lu, or plural rare earth elements. Among these, RE is preferably Y for the reason that substitution with Ba does not easily occur. Furthermore, $\delta$ represents the oxygen non-stoichiometric amount, which is, for example, from 0 to 1. From the viewpoint of obtaining a high superconducting transition temperature, it is more preferable if the value of $\delta$ is closer to 0. Here, in the case of $PrBa_2Cu_3O_{7-\delta}$ in which RE represents Pr, although the phenomenon of superconductivity has not been confirmed for the present, but when the phenomenon of superconductivity can be confirmed in the future by, for example, controlling oxygen non-stoichiometric amount $\delta$ or the like, the oxide superconductor related to the embodiment of the invention is to include $PrBa_2Cu_3O_{7-\delta}$ as well.

Furthermore, $\delta$ of a crystalline material other than $REBa_2Cu_3O_{7-\delta}$ also represents the oxygen non-stoichiometric amount, and for example, $\delta$ is from 0 to 1.

There are no particular limitations on the thickness of the oxide superconducting layer 30, but for example, the thickness is from 500 nm to 3000 nm.

Examples of a method for forming (film-forming) the oxide superconducting layer 30 include a TFA-MOD method, a PLD method, a CVD method, a MOCVD method, and a sputtering method. Among these film-forming methods, a MOCVD method is preferably used, from the viewpoint that a high vacuum is not required, film forming can be achieved even on a metal substrate 10 having a large-sized area and a complicated shape, and mass productivity is excellent. The film forming conditions employed in the case of using a MOCVD method are appropriately set in accordance with the constituent material, thickness and the like of the oxide superconducting layer 30, but for example, preferred conditions include a wire rod conveyance speed of from 10 m/h to 500 m/h, and a film forming temperature of 800° C. to 900° C. (in the case of $YBa_2Cu_3O_{7-\delta}$). Furthermore, at the time of forming a film of $REBa_2Cu_3O_{7-\delta}$, from the viewpoint of enhancing the superconducting characteristics by decreasing the oxygen non-stoichiometric amount $\delta$, it is preferable to carry out the film forming process in an oxygen gas atmosphere.

On the surface of the oxide superconducting layer 30 such as described above, a protective layer 40 composed of silver is formed, for example, by a sputtering method. Furthermore, it is still acceptable to produce a superconducting wire rod 1 by forming the protective layer 40 and then to subject the superconducting wire rod 1 to a heat treatment.

(Schematic Configuration of Substrate for Superconducting Wire Rod and Method for Producing Substrate)

Figure 2:
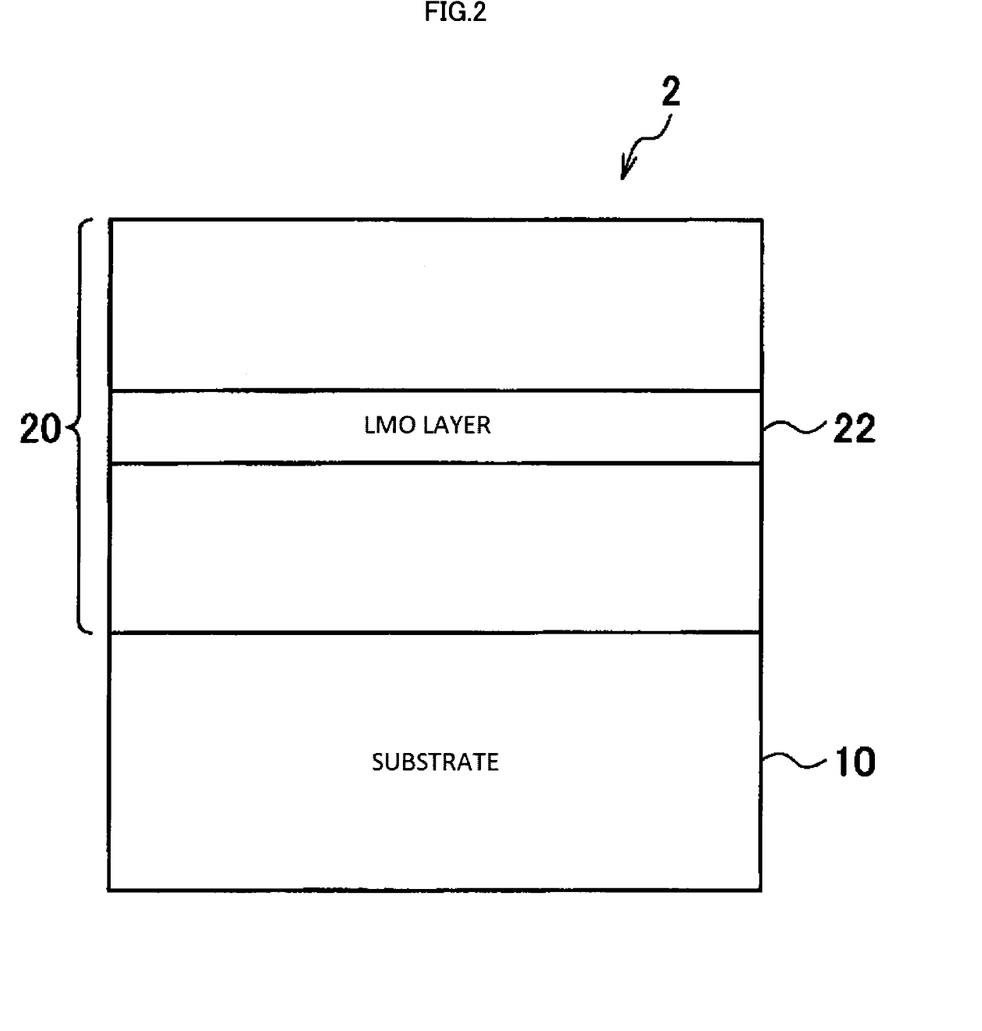
FIG. 2 is a cross-sectional diagram illustrating the schematic configuration of a substrate 2 for a superconducting wire rod according to the embodiment of the invention.

FIG. 2 is a cross-sectional diagram illustrating the schematic configuration of the substrate 2 for a superconducting wire rod according to the embodiment of the invention.

As shown in FIG. 2, the substrate 2 for a superconducting wire rod according to the embodiment of the invention is constituted to include a LMO layer 22 as a part of the intermediate layer 20 or as an intermediate layer 20.

When the LMO layer 22 is a part of the intermediate layer 20, that is, when the intermediate layer 20 includes plural layers, the LMO layer 22 may adopt any of the arrangement in which the LMO layer 22 is sandwiched between two or more other layers that constitute the intermediate layer 20, the arrangement in which the LMO layer 22 is located at the uppermost layer of the intermediate layer 20, and the arrangement in which the LMO layer 22 is located at the lowermost layer in the intermediate layer 20. However, in regard to the LMO layer 22, the arrangement in which the LMO layer 22 is located on the biaxially oriented layer 26 is preferred from the viewpoint that the degree of lattice matching of the LMO layer 22 is small, with respect to the biaxially oriented layer 26 or the oxide superconducting layer 30 that will be described below.

Regarding the LMO layer 22 as such, as previously described in the section Background Art, in order to suppress a decrease in the mechanical strength of the superconducting wire rod 1 while enabling epitaxial growth of the upper layers of the LMO layer 22, it is desirable to lower the phase transition temperature T1 itself at which the crystal lattice of LMO becomes cubic (see FIGS. 4 and 5).

Here, in order to lower the phase transition temperature T1, adjusting the composition of LMO by doping or the like can be considered. Thus, the inventors paid attention to the fact that LMO has a perovskite type crystal structure (unit lattice), and found that as the tolerance factor t approaches 1, strain in the crystals is reduced, and the phase transition temperature T1 can be lowered.

The tolerance factor t is generally used as an index for determining whether a compound represented by the compositional formula $ABO_3$ adopts a perovskite type crystal structure, and the tolerance factor t is defined by the following formula.

$$t = \frac{r_A + r_o}{\sqrt{2}\,(r_B + r_o)}$$

t: tolerance factor $0.75 < t < 1.1$: perovskite ($t = 1 \Rightarrow$ ideal)

$t < 0.75$: ilmenite

Meanwhile, it is said that when the value of t is from 0.75 to 1.1, the above-described compound adopts a perovskite structure, and when the value of t is less than 0.75, the compound adopts another crystal structure (ilmenite structure). Furthermore, in the above formula, $r_A$ represents the ionic radius of the cation that occupies an A site of perovskite; $r_B$ represents the ionic radius of the cation that occupies a B site of perovskite; and $r_O$ represents the ionic radius of oxygen. When the tolerance factor t is 1, an ideal perovskite structure is obtained.

Furthermore, as a method for bringing the tolerance factor t close to 1, a method of increasing $r_A$ in the above formula, or decreasing $r_B$ may be used.

In the following Table 1, Shannon's ionic radii are summarized in relation to those cations that occupy the A site or have a potential of the occupancy, or those cations that occupy the B site or have a potential of the occupancy. Furthermore, the following Table 2 presents the results obtained by determining the tolerance factor t using these ionic radii in a case where LMO is doped with a certain amount of a cation at the A site or the B site. Furthermore, Table 3 presents the results obtained by determining the tolerance factor t when the doping amount of cation Cr at the B site of LMO is changed. Also, Table 4 presents the results obtained by determining the tolerance factor t in a case where LMO is doped with a certain amount of a cation at the A site and the B site.

TABLE 1

| Cation A | | Cation B | | Oxygen | |
|---|---|---|---|---|---|
| Ion type | Radius [Å] | Ion type | Radius [Å] | Ion type | Radius [Å] |
| LaCN12 | 1.36 | Mn3 + CN6HS | 0.645 | O2-CN6 | 1.4 |
| BaCN12 | 1.61 | Cr3 + CN6 | 0.615 | | |
| CaCN12 | 1.34 | Co3 + CN6HS | 0.61 | | |
| SrCN12 | 1.44 | Ti4 + CN6 | 0.605 | | |
| | | Ti3 + CN6 | 0.67 | | |
| | | Al3 + CN6 | 0.535 | | |

TABLE 2

| | Average ionic radius | | |
|---|---|---|---|
| Composition | a | b | t |
| $LaMnO_3$ | 1.36 | 0.645 | 0.954 |
| $La_{0.7}Sr_{0.3}MnO_3$ | 1.384 | 0.645 | 0.963 |
| $La_{0.7}Ba_{0.3}MnO_3$ | 1.435 | 0.645 | 0.980 |
| $La_{0.7}Ca_{0.3}MnO_3$ | 1.354 | 0.645 | 0.952 |
| $LaMn_{0.7}Cr_{0.3}O_3$ | 1.36 | 0.636 | 0.959 |
| $LaMn_{0.7}Co_{0.3}O_3$ | 1.36 | 0.6345 | 0.959 |
| $LaMn_{0.7}Ti_{0.3}O_3$ | 1.36 | 0.633 | 0.960 |
| $LaMn_{0.7}Al_{0.3}O_3$ | 1.36 | 0.612 | 0.970 |

TABLE 3

| | Average ionic radius | | |
|---|---|---|---|
| Composition | a | b | t |
| $LaMn_{0.9}Cr_{0.1}O_3$ | 1.36 | 0.642 | 0.956 |
| $LaMn_{0.8}Cr_{0.2}O_3$ | 1.36 | 0.639 | 0.957 |
| $LaMn_{0.7}Cr_{0.3}O_3$ | 1.36 | 0.636 | 0.959 |
| $LaMn_{0.6}Cr_{0.4}O_3$ | 1.36 | 0.633 | 0.960 |
| $LaMn_{0.5}Cr_{0.5}O_3$ | 1.36 | 0.63 | 0.961 |
| $LaMn_{0.4}Cr_{0.6}O_3$ | 1.36 | 0.627 | 0.963 |
| $LaMn_{0.3}Cr_{0.7}O_3$ | 1.36 | 0.624 | 0.964 |
| $LaMn_{0.2}Cr_{0.8}O_3$ | 1.36 | 0.621 | 0.966 |
| $LaMn_{0.1}Cr_{0.9}O_3$ | 1.36 | 0.618 | 0.967 |
| $LaCrO_3$ | 1.36 | 0.615 | 0.969 |

TABLE 4

| | Average ionic radius | | |
|---|---|---|---|
| Composition | a | b | t |
| $La_{0.7}Sr_{0.3}Mn_{0.7}Cr_{0.3}O_3$ | 1.384 | 0.636 | 0.967 |
| $La_{0.7}Ba_{0.3}Mn_{0.7}Cr_{0.3}O_3$ | 1.435 | 0.636 | 0.985 |
| $La_{0.7}Ca_{0.3}Mn_{0.7}Cr_{0.3}O_3$ | 1.354 | 0.636 | 0.956 |

From the results described above, it is understood that when LMO is doped with at least one selected from Sr or Ba at the A site, the value of t is close to 1 as compared with the case of a LMO that is not doped at all. On the contrary, it is understood that when LMO is doped with Ca at the A site, the value of t is more distant from 1 as compared with the case of a LMO that is not doped at all. Meanwhile, in Patent Document 3, LMO is doped with Sr, Ca or Ba at the A site, but since t is not close to 1 in the case of Ca doping, it is contemplated that Patent Document 3 lacks the purpose such as the purpose of the invention that strain in the crystals is reduced by approaching t to 1, and the phase transition temperature T1 is lowered.

Furthermore, it is understood that when LMO is doped with at least one selected from Cr, Al, Co or Ti at the B site, the value of t is closer to 1 as compared with the case of a LMO that is not doped at all.

Meanwhile, in order to bring the value of t close to 1, LMO may be doped at at least one site of the A site or the B site. However, from the viewpoint that elements such as Ba to be doped at the A site may interfere with stable production of a single crystal phase so as to produce a hydroxide, and that there are many cations capable of doping at the B site rather than the A site, doping LMO at the B site is preferable to doping at the A site.

In view of the consideration described above, the LMO layer 22 is composed of a LMO doped with a cation having a smaller ionic radius than that of Mn at the B site.

Specifically, the LMO layer 22 is an oxide layer composed of a crystalline material represented by the compositional formula: $La_z(Mn_{1-x}M_x)_wO_{3+\delta}$ (wherein M represents at least one selected from Cr, Al, Co or Ti, $\delta$ represents an oxygen non-stoichiometric amount, $0 \leq w/z < 2$, and $0 < x \leq 1$).

Meanwhile, the value of $\delta$ is not particularly limited, but for example, $-1 < \delta < 1$.

Here, the amount x of the substitution by M is set to be greater than zero (>0) in order to bring the tolerance factor t close to 1 so as to reduce strain in the crystals by doping LMO with at least one selected from Cr, Al, Co or Ti, which all have smaller ionic radii than that of Mn, at the B site as described above, and to lower the phase transition temperature T1 at which LMO becomes cubic. Meanwhile, in regard to the LMO layer 22, it is preferable to produce a single crystal phase as described above; however, if there are fewer impurities such as hydroxides than in a case where LMO is doped at the A site, the LMO layer may not have a single crystal phase. That is, the LMO layer 22 is composed of the crystalline material as the principal material, and may contain fewer impurities than in a case where LMO is doped at the A site. Meanwhile, the "principal material" means that among the constituent components contained in the LMO layer 22, the relevant material has the largest content.

The amount x of the substitution by M in the crystalline material that constitutes the LMO layer 22 is preferably 0.1 or greater, and more preferably 0.3 or greater. It is because when the amount x of the substitution by M is 0.1 or greater, the phase transition temperature is further lowered.

Furthermore, from the viewpoint of constructing the LMO layer 22 from a single phase of perovskite type LMO, based on the relationship between the ionic radii of the A site and the B site or the like, w/z of the crystal material is preferably $0.8 \leq w/z \leq 1.1$.

Furthermore, from the viewpoint of suppressing strain and the like in the layer formed on the LMO layer 22 (hereinafter, referred to as an upper layer), it is preferable that the crystal structure of LMO that constitutes the LMO layer 22 have a lattice constant that is intermediate between the lattice constant of the crystal structure of the crystalline material that constitutes the upper layer and the lattice constant of the crystal structure of the crystalline material that constitutes the layer formed under the LMO layer 22 (hereinafter, referred to as lower layer). Meanwhile, in regard to an intermediate structural constant, it is not necessary that all of the length of the a axis, the length of the b axis, and the length of the c axis constitute the structural constant, but any one of these may constitute the structural constant.

Furthermore, being a parameter to the lattice constant, the degree of lattice mismatching (Δ: unit %) between the upper layer and the LMO layer 22 is desirably such that the degree of lattice mismatching is closer to 0 as compared with the degree of lattice mismatching between the upper layer and the lower layer in a case where the upper layer is directly formed on the lower layer, and for example, the degree of lattice mismatching is preferably ±5% or less, and more preferably ±3% or less. Specifically, as will be described below, when the upper layer is composed of $CeO_2$, and the lower layer is composed of MgO that has been formed by IBAD (ion beam assist deposition), the degree of lattice mismatching Δ between the upper layer and the LMO layer 22 is, for example, −2.1%, while the degree of lattice mismatching Δ between the upper layer and the lower layer is, for example, −9.1%.

Meanwhile, the degree of lattice mismatching is defined to be represented by the following relational formula (2):

$$\Delta(\%) = \{(A-As)/As\} \times 100 \quad (2)$$

In the relational formula (2), the symbol As represents the lattice constant of the layer to be deposited (underlying layer), and the symbol A represents the lattice constant of the layer to be deposited on the underlying layer.

The thickness of the LMO layer 22 is not particularly limited; however, from the viewpoint of suppressing the surface roughness of the LMO layer 22, the thickness is preferably 100 nm or less, and from the viewpoint of production, the thickness is preferably 4 nm or greater. A specific value of the thickness may be 30 nm.

Regarding the method for forming (film-forming) the LMO layer 22, film forming according to a PLD method that is carried out while the metal substrate 10 is heated, or a RF sputtering method may be used. The film-forming conditions according to a RF sputtering method may be appropriately set in accordance with the amount x of the substitution by M in $La_z(Mn_{1-x}M_x)_wO_{3+\delta}$ which is the constituent material of the LMO layer 22, the thickness of the LMO layer 22, or the like, and for example, the conditions include the following: sputtering output power: from 100 W to 300 W, wire rod conveyance speed: from 20 m/h to 200 m/h, film-forming temperature (substrate heating temperature): 800° C. or lower, film-forming atmosphere: an Ar gas atmosphere at a pressure of from 0.1 Pa to 1.5 Pa.

Here, the film-forming temperature is not particularly limited as long as it is a temperature at which LMO becomes cubic, but in the embodiment, since a constitution of doping LMO with Cr or the like at the B site is employed, and the phase transition temperature T1 at which LMO becomes cubic has been lowered, the film-forming temperature can be set to be lower as compared with the case of a LMO that is not doped at all. Thereby, imparting a thermal history involving a high temperature and a long time to the metal substrate 10 can be prevented, and a decrease in the mechanical strength of the superconducting wire rod 1 can be suppressed.

Furthermore, when another oxide thin film (another oxide layer that constitutes a part of the intermediate layer 20, or the oxide superconducting layer 30) is epitaxially grown on the LMO layer 22 that is composed of cubic LMO as described above while the metal substrate 10 (including LMO) is heated, as previously explained in the section Background Art, it is necessary to avoid that the crystal lattice of LMO that constitutes the underlying LMO layer 22 changes from cubic to rhombohedral, and thereby, it becomes difficult for another oxide thin film to epitaxially grow on the LMO layer 22. Therefore the heating temperature (film-forming temperature) of the metal substrate 10 should be set to a temperature higher than or equal to the phase transition temperature T1. However, in the embodiment, since the phase transition temperature T1 at which LMO becomes cubic is lowered by adopting a constitution in which the LMO that constitutes the LMO layer 22 is doped with Cr or the like at the B site, the film-forming temperature of the upper layer of the LMO layer 22 can also be lowered.

Thus, the schematic configuration of the substrate 2 for a superconducting wire rod has been described without specifying the arrangement of the LMO layer 22, and the detailed configuration of the substrate 2 for a superconducting wire rod in which the arrangement of the LMO layer 22 is specifically specified will be described below.

(Detailed Configuration of Substrate for Superconducting Wire Rod and Method for Producing the Same)

Figure 3:
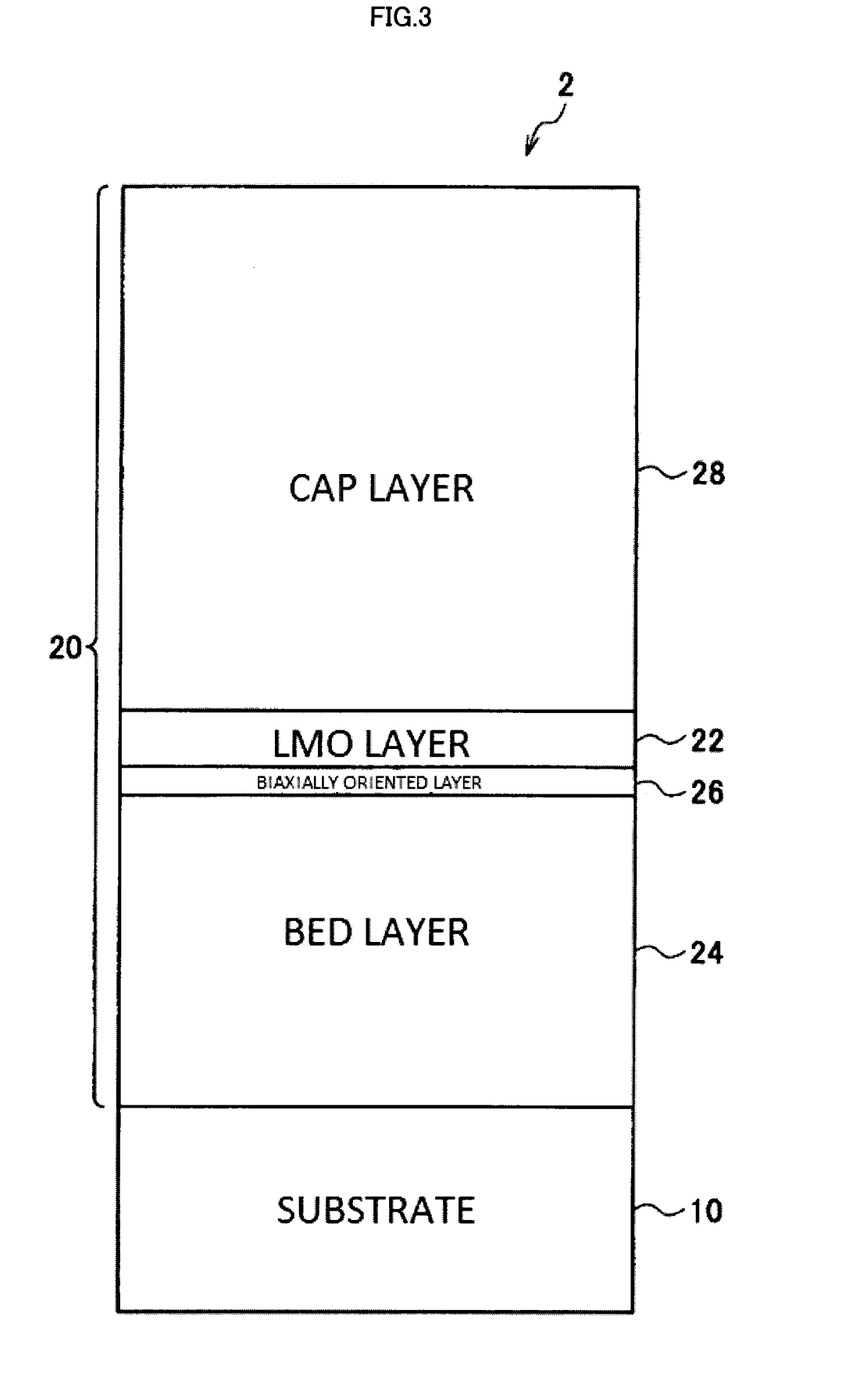
FIG. 3 is a cross-sectional diagram illustrating the detailed configuration of the substrate 2 for a superconducting wire rod according to the embodiment of the invention.

FIG. 3 is a cross-sectional diagram illustrating the detailed configuration of the substrate 2 for a superconducting wire rod according to the embodiment of the invention.

As shown in FIG. 3, the intermediate layer 20 of the substrate 2 for a superconducting wire rod is constituted to include a bed layer 24, a biaxially oriented layer 26, a LMO layer 22, and a cap layer 28.

The bed layer 24 is a layer that is disposed on the metal substrate 10 and is intended to prevent the diffusion of the constituent elements of the metal substrate 10. As the constituent material of the bed layer 24, $Gd_2Zr_2O_7$ (hereinafter, referred to GZO), $YAlO_3$ (yttrium aluminate), YSZ (yittria-stabilized zirconia), $Y_2O_3$, $Gd_2O_3$, $Al_2O_3$, $Sc_2O_3$, $Cr_2O_3$, REZrO, $RE_2O_3$ or the like can be used. Here, RE represents a single rare earth element, or plural rare earth elements. Meanwhile, the bed layer 24 may have other functions such as, for example, enhancing the biaxial orientation, together with the diffusion preventing function. Meanwhile, in order to impart a function of enhancing the biaxial orientation, it is preferable to use amorphous GZO as the constituent material of the bed layer 24.

The thickness of the bed layer 24 is not particularly limited, but for example, the thickness may be from 20 nm to 200 nm. A specific value of the thickness may be 110 nm.

An example of the method for forming (film-forming) the bed layer 24 may be a method of forming a film by a RF sputtering method in an argon atmosphere.

In the RF sputtering method, a film is formed by causing inert gas ions (for example, $Ar^+$) generated by plasma discharge to collide with a deposition source (GZO or the like), and depositing the deposition particles thus ejected on the surface for film-forming. The film-forming conditions at this time are appropriately set in accordance with the constituent material, thickness or the like of the bed layer 24, but for example, the conditions may include the following: RF sputter output power: from 100 W to 500 W, wire rod conveyance speed: from 10 m/h to 100 m/h, and film-forming temperature: from 20° C. to 500° C.

Meanwhile, in the film-forming process for the bed layer 24, an ion beam sputtering method of causing the ions generated by an ion generating machine (ion gun) to collide with a deposition source, can also be used. Furthermore, the bed layer 24 can have a multilayer structure of a combination of a $Y_2O_3$ layer and an $Al_2O_3$ layer, or the like.

The biaxially oriented layer 26 is a layer that is disposed on the bed layer 24 and is intended to orient the crystals of the oxide superconducting layer 30 in a constant direction. Examples of the constituent material for the biaxially oriented layer 26 include polycrystalline materials such as NbO and MgO. Furthermore, the same material as that of the bed layer 24, for example, GZO, can also be used.

The thickness of the biaxially oriented layer 26 is not particularly limited, but for example, the thickness is from 1 nm to 20 nm. A specific value of the thickness may be 5 nm.

An example of the method for forming (film-forming) the biaxially oriented layer 26 may be a method of forming a film by an IBAD method in an atmosphere of argon, oxygen, or a mixed gas of argon and oxygen. In the IBAD method, a film is formed by depositing deposition particles ejected from a deposition source (MgO or the like) by RF sputtering (or ion beam sputtering) on the surface for film forming, while irradiating an assist ion beam in a direction oblique to the surface for film forming. The film-forming conditions at this time are appropriately set in accordance with the constituent material, thickness and the like of the biaxially oriented layer 26, but for example, the conditions include the following: assist ion beam voltage: from 800 V to 1500 V, assist ion beam current: from 80 mA to 350 mA, assist ion beam accelerating voltage: 200 V, RF sputter output power: from 800 W to 1500 W, wire rod conveyance speed: from 80 m/h to 500 m/h, and film-forming temperature: from 5° C. to 250° C.

Meanwhile, in the film forming of the biaxially oriented layer 26, reactive sputtering can be utilized, in which, for example, Mg as a deposition source is sputtered in an atmosphere of a mixed gas of argon and oxygen, and thereby Mg thus ejected is caused to react with oxygen to form a film of MgO. Furthermore, the biaxially oriented layer 26 may also be a composite layer composed of a layer obtained by forming a film by an epitaxial method and a layer obtained by forming a film by IBAD.

The LMO layer 22 is disposed between the biaxially oriented layer 26 and the cap layer 28, and has the configuration described above. As such, the LMO layer 22 has a function of enhancing the lattice matching property of the cap layer 28 by being disposed between the biaxially oriented layer 26 and the cap layer 28.

The cap layer 28 is a layer that is disposed on the LMO layer 22 and is intended to increase the lattice matching property with the oxide superconducting layer 30. Specifically, the cap layer 28 is composed of a fluorite type crystal structure having self-orientation. This fluorite type crystal structure is, for example, at least one selected from $CeO_2$ or $PrO_2$. Furthermore, the cap layer 28 may contain impurities other than the fluorite type crystal structure.

The thickness of the cap layer 28 is not particularly limited, but in order to obtain sufficient orientation, the thickness is preferably 100 nm or greater, and more preferably 500 nm or greater. However, if the thickness is greater than 5000 nm, crystal orientation becomes poor. Therefore, it is preferable to set the thickness to 5000 nm or less.

An example of the method for forming (film-forming) this cap layer 28 may be a method of forming a film by a PLD method or a RF sputtering method, and epitaxially growing the formed film. The film-forming conditions according to a RF sputtering method are appropriately set in accordance with the constituent material, thickness or the like of the cap layer 28, but for example, the conditions include the following: RF sputter output power: from 400 W to 2000 W, wire rod conveyance speed: from 2 m/h to 50 m/h, and film-forming temperature: from 400° C. to 800° C.

Here, when the cap layer 28 is epitaxially growing on the LMO layer 22 that is composed of cubic LMO as described above while the metal substrate 10 (including the LMO layer 22 as well) is heated, as previously described in the section Background Art, it is necessary to avoid that the crystal lattice of LMO that constitutes the underlying LMO layer 22 changes from cubic to rhombohedral so that it becomes difficult for the cap layer 28 to epitaxially grow on the LMO layer 22. Therefore, the heating temperature (film-forming temperature) of the metal substrate 10 should be set to a temperature higher than or equal to the phase transition temperature T1. However, in the embodiment, since the phase transition temperature T1 at which LMO becomes cubic is lowered by adopting a constitution in which the LMO that constitutes the LMO layer 22 is doped with Cr or the like at the B site, the film-forming temperature of the cap layer 28 (upper layer) formed on the LMO layer 22 can also be lowered, for example, to a temperature lower than the phase transition temperature T1 of LMO that is not doped at all (500° C.).

(Modification Example)

Meanwhile, the specific embodiments of the invention has been described in detail, but the invention is not intended to be limited to the embodiments, and it will be obvious to those having ordinary skill in the art that various other exemplary embodiments can be made within the scope of the invention. For example, plural exemplary embodiments described above can be carried out in appropriate combination. Furthermore, the following modification examples may also be appropriately combined.

For example, the bed layer 24 or the protective layer 40 can be omitted. Regarding the metal substrate 10, the case in which the metal substrate is composed of a metal has been described, but the substrate 10 may be formed from a resin having high heat resistance or the like.

Meanwhile, the entirety of the disclosure of Japanese Patent Application No. 2010-246056 is incorporated herein by reference.

All publications, patent applications, and technical standards mentioned in this specification are herein incorporated by reference to the same extent as if each individual publication, patent application, or technical standard was specifically and individually indicated to be incorporated by reference.

EXAMPLES

Hereinafter, a substrate for a superconducting wire rod, the superconducting wire rod, and a method for producing the superconducting wire rod according to the invention will be described by way of Examples, but the invention is not intended to be limited by these Examples.

Example 1

On a Hastelloy substrate as a metal substrate 10, with the surface of the substrate having been mechanically polished, a biaxially oriented layer 26 was formed by a reactive sputtering method by using Mg as a target while an assist ion beam was irradiated. On the biaxially oriented layer 26, a LMO layer 22 composed of $La(Mn_{0.7}Cr_{0.3})O_{3+\delta}$ was formed to a thickness of 10 nm by a RF sputtering method in an Ar gas atmosphere at a pressure of 4 mTorr, at a RF power of 200 W and a substrate temperature of 700° C. Furthermore, a cap layer 28 composed of $CeO_2$ was formed thereon to a thickness of 200 nm by a RF sputtering method, in an Ar gas atmosphere at a pressure of 3 mTorr, at a RF power of 800 W and a substrate temperature of 480° C.

Thus, a substrate for a superconducting wire rod according to Example 1 was produced through the production processes described above.

Example 2

On a substrate composed of Hastelloy C276 alloy as a metal substrate 10, with the surface of the substrate having been mechanically polished, a biaxially oriented layer 26 was formed by a reactive sputtering method by using Mg as a target while an assist ion beam was irradiated. On the biaxially oriented layer 26, a LMO layer 22 composed of La(Mn$_{0.7}$Cr$_{0.3}$)O$_{3+\delta}$ was formed to a thickness of 10 nm by a RF sputtering method in an Ar gas atmosphere at a pressure of 4 mTorr, at a RF power of 200 W and a substrate temperature of 600° C. Furthermore, a cap layer 28 composed of CeO$_2$ was formed thereon to a thickness of 200 nm by a RF sputtering method, in an Ar gas atmosphere at a pressure of 3 mTorr, at a RF power of 800 W and a substrate temperature of 480° C.

Thus, a substrate for a superconducting wire rod according to Example 2 was produced through the production processes described above.

Comparative Example 1

On a substrate composed of Hastelloy C276 alloy as a metal substrate 10, with the surface of the substrate having been mechanically polished, a biaxially oriented layer 26 was formed by a reactive sputtering method by using Mg as a target while an assist ion beam was irradiated. On the biaxially oriented layer 26, a LMO layer 22 composed of LaMn)$_{3+\delta}$ which was not doped at all, was formed to a thickness of 10 nm by a RF sputtering method in an Ar gas atmosphere at a pressure of 4 mTorr, at a RF power of 200 W and a substrate temperature of 700° C. Furthermore, a cap layer 28 composed of CeO$_2$ was formed thereon to a thickness of 200 nm by a RF sputtering method, in an Ar gas atmosphere at a pressure of 3 mTorr, at a RF power of 800 W and a substrate temperature of 480° C.

Thus, a substrate for a superconducting wire rod according to Comparative Example 1 was produced through the production processes described above.

Comparative Example 2

On a substrate composed of Hastelloy C276 alloy as a metal substrate 10, with the surface of the substrate having been mechanically polished, a biaxially oriented layer 26 was formed by a reactive sputtering method by using Mg as a target while an assist ion beam was irradiated. On the biaxially oriented layer 26, a LMO layer 22 composed of LaMnO$_{3+\delta}$ which was not doped at all, was formed to a thickness of 10 nm by a RF sputtering method in an Ar gas atmosphere at a pressure of 4 mTorr, at a RF power of 200 W and a substrate temperature of 700° C. Furthermore, a cap layer 28 composed of CeO$_2$ was formed thereon to a thickness of 200 nm by a RF sputtering method, in an Ar gas atmosphere at a pressure of 3 mTorr, at a RF power of 800 W and a substrate temperature of 510° C.

Thus, a substrate for a superconducting wire rod according to Comparative Example 2 was produced through the production processes described above.

(Evaluation)

The evaluation methods and evaluation results for the substrates for superconducting wire rods produced in Examples 1 and 2 and Comparative Examples 1 and 2 will be described below.

For the cap layer 28 of each of the substrate for a superconducting wire rod according to the Examples and Comparative Examples, an X-ray diffraction analysis was carried out according to a 2θ-θ method by using an X-ray diffraction apparatus RAD-B manufactured by Rigaku Co., Ltd.

From these measurement results, the degree of orientation of the CeO$_2$ (200) and the count intensity of the (200) of each of the cap layers 28 were evaluated. The evaluation results are presented in the following Table 5.

TABLE 5

| | Constitution of LMO layer | Film-forming temperature of LMO layer (° C.) | Film-forming temperature of cap layer (° C.) | Degree of orientation of (200) of cap layer (%) | Count intensity of (200) of cap layer (cps) |
|---|---|---|---|---|---|
| Example 1 | La(Mn$_{0.7}$Cr$_{0.3}$)O$_{3+\delta}$ | 700 | 480 | 100 | 50000 |
| Example 2 | La(Mn$_{0.7}$Cr$_{0.3}$)O$_{3+\delta}$ | 600 | 480 | 100 | 50000 |
| Comparative Example 1 | LaMnO$_{3+\delta}$ | 700 | 480 | 40 | 900 |
| Comparative Example 2 | LaMnO$_{3+\delta}$ | 700 | 510 | 100 | 50000 |

From the results presented in Table 5, it was confirmed that in the substrate for a superconducting wire rod according to Comparative Example 1, the degree of orientation of the CeO$_2$ (200) and the count intensity of the (200) of the cap layer 28 were extremely lower than those of other Examples. This is contemplated to be attributable to the change of the crystal lattice of LMO from cubic to rhombohedral in the process of film-forming of the cap layer 28, because the film-forming temperature of the cap layer 28 was lower than the phase transition temperature T1 of LMO.

Furthermore, it can be confirmed that in the substrate for a superconducting wire rod according to Comparative Example 2, the degree of orientation of the CeO$_2$ (200) and the count intensity of the (200) of the cap layer 28 were satisfactory to an equal extent to Examples 1 and 2. This is contemplated to be attributable to the fact that the crystal lattice of LMO could be maintained cubic in the film-forming process for the cap layer 28, because the film-forming temperature of the cap layer 28 was higher than the phase transition temperature T1 of LMO.

However, in this case, since the film-forming temperature of the cap layer 28 is high, a thermal history involving a high temperature and a long time is imparted to the metal substrate 10, and thus the mechanical strength of the superconducting wire rod 1 is decreased.

On the contrary, in the substrates for superconducting wire rods according to Examples 1 and 2, even though the film-forming temperature of the cap layer 28 was set to a temperature lower than that of Comparative Example 2 and to a temperature equal to that of Comparative Example 1, the same results as the results for Comparative Example 2 were obtained in terms of the degree of orientation of the CeO$_2$ (200) and the count intensity of the (200) of the cap layer 28, without being poor as in the case of Comparative Example 1. This is contemplated to be attributable to the fact that since Examples 1 and 2 had the constitution in which LMO was doped with Cr or the like at the B site, the phase transition temperature T1 at which LMO became cubic was lower than 480° C., and the crystal lattice of LMO could be maintained cubic even if the cap layer 28 was formed at 480° C.

As such, in a case in which the film-forming temperature of the cap layer 28 can be lowered as compared with Comparative Example 2, imparting a thermal history involving a high temperature and a long time to the metal substrate 10 can be prevented, and a decrease in the mechanical strength of the superconducting wire rod 1 can be suppressed.

Furthermore, in Example 2, although the film-forming temperature of the LMO layer 22 can be set to be lower than that of Example 1, even in this case, the same results as those for Example 1 were obtained. Further, when the film-forming temperature of the LMO layer 22 is lowered as such, imparting a thermal history involving a high temperature and a long time to the metal substrate 10 can be prevented, and a decrease in the mechanical strength of the superconducting wire rod 1 can be suppressed.

DESCRIPTION OF REFERENCE NUMERALS

1 superconducting wire rod
2 substrate for superconducting wire rod
10 metal substrate (substrate body)
22 LMO layer (oxide layer)
26 biaxially oriented layer (orientation layer)
28 cap layer
30 oxide superconducting layer (superconducting layer)

The invention claimed is:

1. A substrate for a superconducting wire rod, the substrate comprising:
an oxide layer comprising a crystalline material represented by the compositional formula La$_z$(Mn$_{1-x}$M$_x$)$_w$O$_{3+\delta}$,
wherein M represents at least one element selected from the group consisting of Al, Co, and Ti, δ represents an oxygen non-stoichiometric amount, 0<w/z<2, and 0<x<1.

2. The substrate for a superconducting wire rod according to claim 1, wherein an amount x of the substitution by M in the crystalline material is 0.1≤x<1.

3. The substrate for a superconducting wire rod according to claim 1, wherein w/z of the crystalline material is 0.8≤w/z≤1.1.

4. The substrate for a superconducting wire rod according to claim 1, further comprising:
an orientation layer that is biaxially oriented,
wherein the oxide layer is disposed on the orientation layer.

5. The substrate for a superconducting wire rod according to claim 1, wherein a cap layer comprising a fluorite-type crystal structure composed of at least one selected from the group consisting of CeO$_2$ and PrO$_2$ is disposed on the oxide layer.

6. A superconducting wire rod comprising:
the substrate for a superconducting wire rod according to claim 1; and
a superconducting layer that is disposed on the substrate for a superconducting wire rod and includes an oxide superconductor.

7. The substrate for a superconducting wire rod according to claim 1, wherein M represents Al.

8. The superconducting wire rod of claim 6, wherein a thickness of superconducting layer is from 500nm to 3,000nm.

9. The superconducting wire rod of claim 6, further comprising a protective layer.

10. The substrate according to claim 1, further comprising a metal substrate layer on which an intermediate layer comprising the oxide layer or consisting of the oxide layer is disposed.

11. The substrate for a superconducting wire rod according to claim 10, wherein the intermediate layer comprises or consists of a plurality of oxide layers.

12. The substrate for a superconducting wire rod according to claim 1, wherein a thickness of the oxide layer is from 4nm to 100nm.

13. The substrate according to claim 1, comprising an intermediate layer comprising a bed layer, a biaxially oriented layer, the oxide layer, and a cap layer disposed in this order.

14. The substrate according to claim 13, wherein the bed layer is made of at least one material selected from the group consisting of Gd$_2$Zr$_2$O$_7$, YAlO$_3$, yittria-stabilized zirconia (YSZ), Y$_2$O$_3$, Gd$_2$O$_3$, Al$_2$O$_3$, Sc$_2$O$_3$, Cr$_2$O$_3$, REZrO, and RE$_2$O$_3$.

15. The substrate according to claim 4, wherein a thickness of the biaxially oriented layer is from 1 to 20nm.

16. The substrate according to claim 13, wherein a thickness of the cap layer is from 100nm to 5,000nm.

17. The substrate according to claim 1, wherein the oxide layer is sandwiched between two or more other layers of the substrate.

18. The substrate according to claim 1, wherein a crystal structure of the crystalline material represented by the compositional formula La$_z$(Mn$_{1-x}$M$_x$)$_w$O$_{3+\delta}$ has a lattice constant that is intermediate between a lattice constant of a crystal structure of a crystalline material of a layer formed above the oxide layer and a lattice constant of a crystal structure of a crystalline material of a layer formed under the oxide layer.

19. A method for producing a superconducting wire rod, the method comprising:
forming an oxide layer comprising a crystalline material represented by the compositional formula La$_z$(Mn$_{1-x}$M$_x$)$_w$O$_3$+δ on a substrate while heating the substrate, wherein M represents at least one element selected from the group consisting of Al, Co, and Ti, δ represents an oxygen non-stoichiometric amount, 0<w/z<2, and 0<x<1; and
epitaxially growing a thin film on the oxide layer while heating the substrate on which the oxide layer is formed.

20. The method according to claim 19, wherein a heating film-forming temperature is higher or equal to a phase transition temperature T1 at which the crystalline material represented by the compositional formula La$_z$(Mn$_{1-x}$M$_x$)$_w$O$_{3+}$δ becomes cubic.

* * * * *